(12) United States Patent
Rzeszewski (10) Patent No.: US 6,377,639 B1
(45) Date of Patent: Apr. 23, 2002

(54) METHOD, SYSTEM, AND APPARATUS FOR UNAMBIGUOUS PHASE SYNCHRONIZATION

(76) Inventor: Theordore Stanley Rzeszewski, 1315 Yorkshire Woods Ct., Wheaton, IL (US) 60187

( * ) Notice: Subject to any disclaimer, the term of this patent is extended or adjusted under 35 U.S.C. 154(b) by 0 days.

(21) Appl. No.: 09/016,568

(22) Filed: Jan. 30, 1998

(51) Int. Cl.[7] .................................................. H04L 7/00
(52) U.S. Cl. ........................ 375/354; 375/235; 375/326; 375/344
(58) Field of Search ................................... 375/354, 326, 375/235, 233, 211, 261, 344, 316; 370/210; 327/233

(56) References Cited

U.S. PATENT DOCUMENTS 5,353,307 A * 10/1994 Lester et al. ................ 375/233
5,732,109 A * 3/1998 Takahashi .................... 375/326
5,852,629 A * 12/1998 Iwamatsu .................... 375/211
5,920,595 A * 7/1999 Iwamatsu .................... 375/235

* cited by examiner

Primary Examiner—Stephen Chin
Assistant Examiner—Shuwang Liu
(74) Attorney, Agent, or Firm—Charles D. Gavrilovich, Jr.; Romi Bose; Hisashi D. Watanabe (57) ABSTRACT

A transmitter (500) transmits an original digital code in a transmitted signal component of a transmitted signal to a receiver (600) through a communication channel. The receiver (600) receives a received signal having a first received signal component and a second received signal component where the transmitted signal component results in the second received signal component. The receiver (600) determines a phase between the received signal and the corresponding transmitted signal by detecting a resulting digital code in the first received signal component. A resulting digital code appears in the first received signal component when the received signal is out of phase with the transmitted signal.

30 Claims, 4 Drawing Sheets

METHOD, SYSTEM, AND APPARATUS FOR UNAMBIGUOUS PHASE SYNCHRONIZATION

BACKGROUND OF THE INVENTION

This invention relates generally to phase synchronization of a radio frequency signal and specifically to unambiguous phase synchronization of a digitally modulated radio frequency signal.

Many digital communication systems employ synchronous detection of a radio frequency carrier transmitted from a transmitter to a receiver. These systems require the received signal to be phase synchronized to the transmitted signal in order for synchronous detection to properly occur. However, conventional synchronization techniques result in phase ambiguity.

Phase ambiguity is caused by the receiver acquiring a transmitted carrier signal but not knowing the orientation or phase of that signal in relation to the signal as transmitted. One example of phase ambiguity occurs in conventional quadrature amplitude modulated (QAM) signaling. A QAM signal can be thought of as a constellation of points arrayed in a phase plane with a real and imaginary axis. The transmitted QAM signal is in phase alignment with the received QAM signal when the axes defining the phase plane of the received QAM signal are oriented and aligned the same way as the transmitted plane's axes. A phase ambiguity results when the receiver acts as if phase alignment has been achieved, but in actuality the received signal is inverted and 180 degrees out of phase (or some other angle than zero degrees).

Effects of phase ambiguity can be demonstrated in the example of two phase ambiguity that occurs in many systems. A received value may be either a binary "1" or "0". The signal corresponding to a "1" is 180 degrees out of phase with the signal corresponding to a "0", such that when the phase synchronization of the system is 180 degrees out of phase, data will be inverted. Until the ambiguity is resolved, the receiver is able to detect a symbol, but does not know if the received symbol is a "1" or "0".

One attempt at solving the problem of phase ambiguity includes differential detection techniques. In a traditional differential detection implementation, the receiver contains circuitry to split the signal and recombine a delayed version of the signal with the original signal. However, differential detection techniques result in additional signal errors due to the delayed versions of original signal errors.

Another attempt at solving the phase ambiguity problem includes the use of a pilot carrier. This approach reduces phase ambiguity inherent in synchronous detection by using a reference carrier having a phase offset of ninety degrees. The pilot carrier approach has the advantage of achieving phase synchronization and eliminating phase ambiguity. However, this technique requires costly additional circuitry to generate the reference carrier and assure that the reference carrier is ninety degrees out of phase with the RF carrier. Further, additional power is needed to generate the reference carrier resulting in a decrease in power efficiency of the system.

Therefore, there exists a need for a method, apparatus, and system for efficiently and inexpensively acquiring unambiguous phase synchronization of a RF carrier in a digital communication system.

DETAILED DESCRIPTION OF THE PREFERRED EMBODIMENT

The present invention provides a method, apparatus and system for efficiently and inexpensively acquiring unambiguous phase synchronization of a RF carrier in a digital communication system.

As is discussed in detail below, a transmitter transmits an original digital code in a transmitted signal component of a transmitted signal to a receiver through a communication channel. The receiver receives a received signal having a first received signal component and a second received signal component where the transmitted signal component results in the second received signal component. The receiver determines a phase between the received signal and the corresponding transmitted signal by detecting a resulting digital code in the first received signal component. The resulting digital code appears in the first received signal component when the received signal is out of phase with the transmitted signal and a component of the original digital code results in the resulting digital code.

Figure 1:
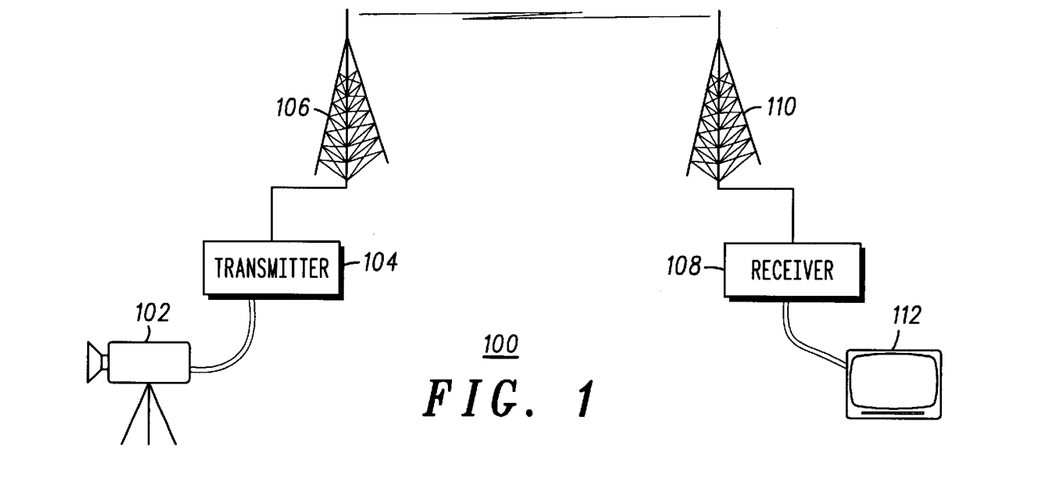
FIG. 1 is a block diagram of a communication system in accordance with the preferred embodiment of the invention.

Referring to the figures, FIG. 1 is a block diagram of a digital communication system in accordance with the present invention. In the preferred embodiment of the invention, a transmitter 104, using quadrature amplitude modulation (QAM) signaling, encodes a binary code into one of the components (e.g. "I" component) of the QAM signal. The receiver 108 attempts to detect the binary code in the other component (e.g. "Q" component). If the binary code is detected by the receiver 108, the received signal is not phase aligned with the transmitted signal and the received signal is phase rotated.

Although in the preferred embodiment the communication system is an advance television digital system 100, any synchronous digital communication system may be employed.

An advance television digital system 100 comprises an advance television digital camera 102 for capturing advance television video images. The advance digital television camera 102 sends the video images to an advance digital television transmitter 104. The advanced digital television transmitter 104 uses QAM signaling to encode the video signal received from the video camera 102. The encoded signal is transmitted by the transmitter 104 through an antenna 106. The advance digital television receiver 108 receives the transmitted signal through a second antenna 110. The signal is then processed and the corresponding advance digital television signal is displayed on a video monitor 112.

The preferred embodiment uses the Advance Television Digital Standard set forth by the Grand Alliance Advance Television Standard. However, other implementations of digital television may be used.

Figure 2:
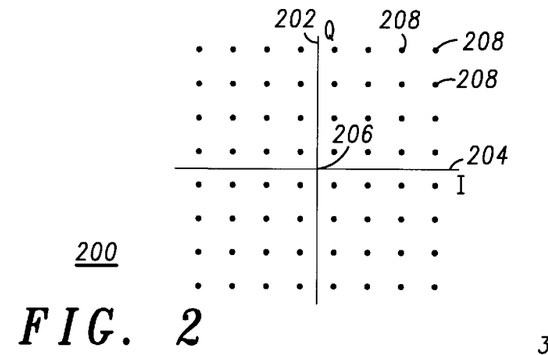
FIG. 2 is a graphical representation of a QAM signal in a phase plane in accordance with the preferred embodiment of the invention.

FIG. 2 is a graphical representation of a QAM signal constellation in a phase plane 200 in accordance with the present invention. The phase plane 200 is defined by a quadrature axis "Q" 202, and an in phase axis "I" 204. The "I" 204 and "Q" 202 axes have a predetermined offset of ninety degrees. The "I" 204 and "Q" 202 axes meet at an origin 206 of the phase plane 200. The signal points 208 of a QAM signal create what is commonly referred to as a constellation on the phase plane 200.

Figure 3:
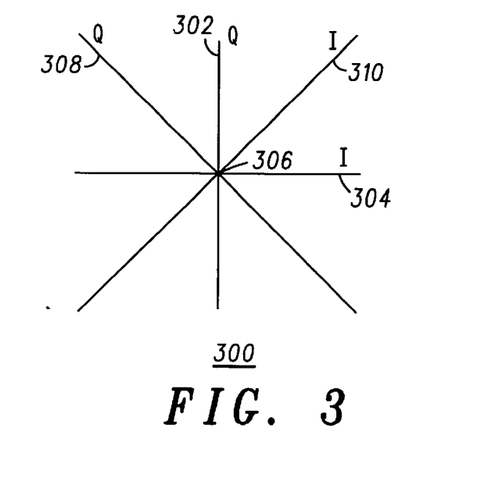
FIG. 3 is a graphical representation of transmitted and received QAM signal that is not phase aligned in accordance with the preferred embodiment of the invention.

FIG. 3 is a graphical representation of a transmitted and received QAM signal that is not phase aligned in accordance with the present invention. The transmitted signal has a phase plane defined by the "Q" axis 302 and "I" axis 304. The "Q" axis 302 and "I" axis 304 intersect at the origin 306 of the transmitted phase plane. The received QAM signal has a phase defined by the received "Q" axis 308 and "I" axis 310 with an origin 306 at the intersection of the "Q" 308 and "I" 310 axis.

As is shown from the graphical portrayal of the transmitted and received signals, phase synchronization has not occurred. Numerous known methods may be used for carrier synchronization. However, once carrier synchronization has occurred, the phases of the transmitted and received signal must be synchronized.

Figure 4:
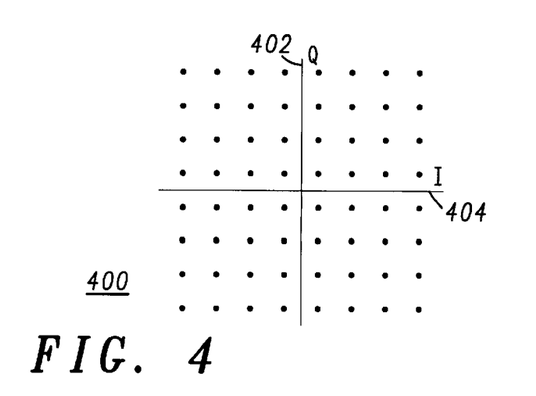
FIG. 4 is a graphical portrayal of a carrier and phase synchronized QAM signals in accordance with the preferred embodiment of the invention.

FIG. 4 is a graphical portrayal of a carrier and phase synchronized QAM signals 400. The transmitted and received signal's "Q" axes 402 are aligned and the transmitted and received signal's "I" axes 404 are also aligned. The alignment or orientation of the axis show the transmitted and received signals are in phase alignment.

Figure 5:
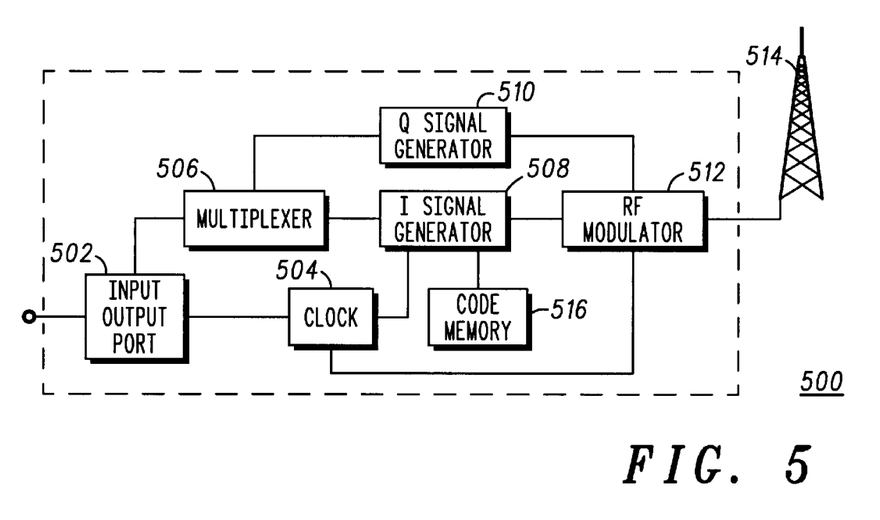
FIG. 5 is a block diagram of an advance television digital transmitter in accordance with the preferred embodiment of the invention.

FIG. 5 is block diagram of an advance television digital transmitter 500. The transmitter 500 has an input/output port 502 adapted to receiving a digital signal. The speed of the input/output port 502 is controlled by a clock 504. As the data is received by the input/output port, a multiplexer 506 divides the data into high and low order data bits. The high order bits are sent to the "I" transmitted signal component generator 508 and the low order bits are sent to the "Q" transmitted signal component generator 510. Together the "I" transmitted signal component 508 and "Q" transmitted signal component 510 are combined at the RF modulator 512. The timing of the data in the transmitted signal is controlled by the clock 504. The transmitted signal from the RF modulator 512 is transmitted through an antenna 514.

At predetermined times controlled by the clock 504, a value is placed in the "I" component of the QAM signal by the "I" component signal generator 508. The code is sent to the "I" component signal generator 508 from the code memory 516. At predetermined intervals, a code value is sent from the code memory 516 to the "I" component signal generator 508 to be placed in the "I" component of the transmitted QAM signal.

Figure 6:
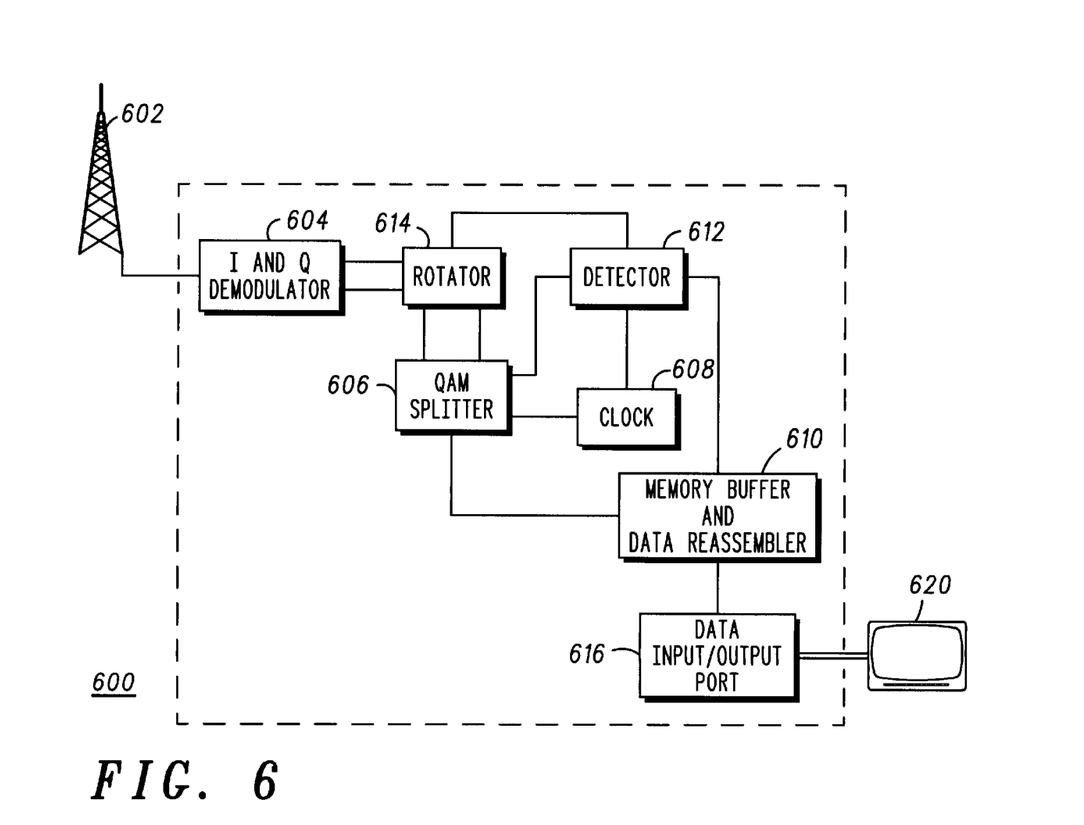
FIG. 6 is a block diagram of a advance television digital receiver in accordance with the preferred embodiment of the invention.

FIG. 6 is a block diagram of a advance television digital receiver 600 in accordance with the preferred embodiment. The receiver 600 is adapted to receive a received signal through an antenna 602. The received signal contains a first received signal component which is, preferably, the "I" QAM signal component of an advance digital television signal and a second received signal component corresponding to the "Q" QAM signal component of an advance digital television signal with a predetermined phase offset of ninety degrees. The received signal from the antenna 602 is demodulated by "I" and "Q" demodulator 604 and are estimates of the "I" and "Q" components of the received signal. The QAM splitter 606 receives a clock signal from a clock source 608. The clock source 608 is used for timing to properly identify the "I" and "Q" component symbols. The "I" component signal is sent from the QAM splitter 606 to the memory buffer and data reassembler 610. The "Q" signal is sent from the QAM splitter 606 to the detector 612. The detector 612 detects the binary code in the "Q" component.

The detector 612 determines the phase between the received signal and the transmitted signal by detecting a resulting digital code in the first received signal component. The detection of the resulting digital code by the detector 612 occur at periods as controlled by a signal from the clock 608. If a digital code is detected by the detector 612, a control signal is sent from the detector 612 to the rotator 614.

The rotator 614 rotates the phase of the received signal in a phase domain until the received signal is in phase with the corresponding transmitted signal. The rotator 614 is capable of rotating the phase of a received signal in a clockwise or counter-clockwise direction. The "Q" component is connected to the memory buffer and data reassembler 610. The binary data from the "I" channel and "Q" channel is then combined in the memory buffer and reassembler 610 into digital data. The digital data from the memory buffer and reassembler 610 is sent to an advance television monitor 620 through a data input/output port 616.

Figure 7:
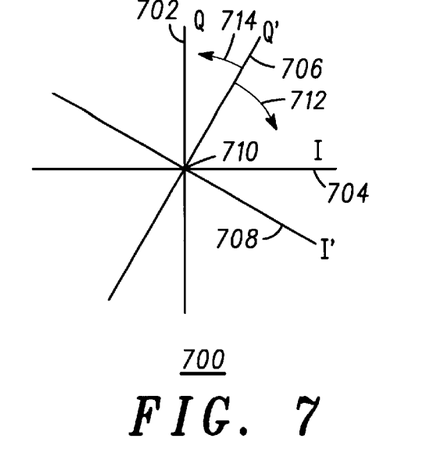
FIG. 7 is a graphical representation of a QAM signal in a phase plane in accordance with the preferred embodiment of the invention.

FIG. 7 is a graphical representation of a QAM signal in a phase plane 700 as used in the preferred embodiment. The transmitted signal is the phase plane represented by the "Q" QAM signal 702 and "I" QAM signal 704. The received signal is represented by the "Q'" QAM signal 706 and "I'" QAM signal 708. The transmitted signal and received signals are carrier synchronized and a static relationship between the two constellations is depicted by the "Q" 702 and "I" 704 axes compared to "Q'" 706 and "I'" 708 axes. The rotator 614 is adapted to rotate the received signal in a clockwise direction 712 or counter-clockwise direction 714. The technique of rotating the phase of a received signal in a clockwise or counter-clockwise direction is commonly known by a person skilled in the art.

Figure 8:
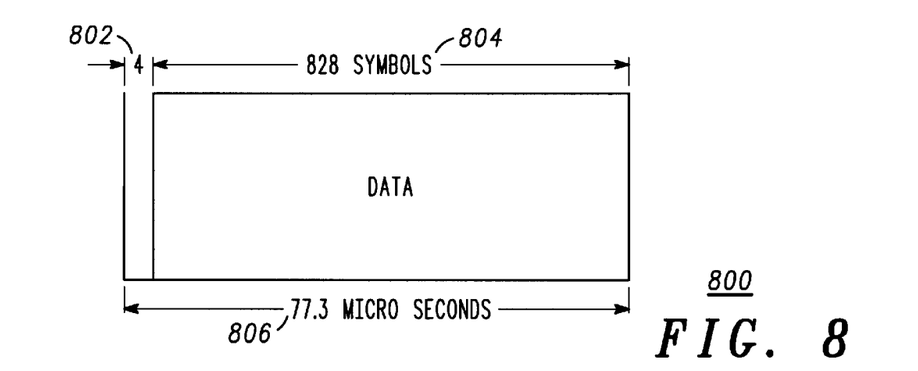
FIG. 8 is a drawing of a data frame as defined by the Grand Alliance Advance Television Specification in accordance with the preferred embodiment.

FIG. 8 is a drawing of a data frame 800 as defined by the Grand Alliance Advance Television Specification as adopted by the Federal Communication in accordance with the preferred embodiment. The data frame 800 contains eight hundred thirty two symbols with four symbols 802 for segment synchronization for the frame 800 and eight hundred twenty eight symbols 804 for data in the frame 800. The time required to transmit the frame 800 is 77.3 microseconds 806. By placing a code in the four symbols 802 that are defined for segment synchronization of data frames in the Grand Alliance Advance Television Standard, the problem of phase ambiguity can be resolved without additional overhead in the protocol.

Figure 9:
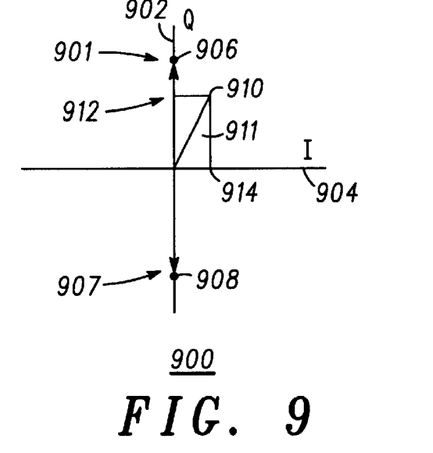
FIG. 9 is a graphical representation of a phase plane having a code placed in the "Q" QAM component in accordance with the preferred embodiment.

FIG. 9 is a graphical portrayal of a phase plane 900 having a code placed in the "Q" QAM component as used in the preferred embodiment. The phase plane 900 has a vector 901 having a maximum value for a signal point 906 in the "Q" component 902 and a second vector 907 having a minimum value for a signal point 908 also lying in the "Q" component 902. The signal points 906, 908 do not have any "I" component 904 and therefore lie on the "Q" component's axis 902. If the constellation is not phase aligned and a maximum QAM signal point lying in the "Q" axis is transmitted the received QAM signal point will not be a maximum value for a signal point 906 in the "Q" axis 902, rather it may be a signal point 910 lying off the "Q" axis 902.

The vector 911 defining the signal point 910 may not be on the "Q" axis 902 when the constellation is not phase aligned. If the signal point is not on the "Q" axis 912, then the vector will have a detectable "I" component 914. As long as an "I" component 914 is detectable, phase alignment is required.

The signal point can lie on the "Q" axis when phase alignment exist or when the received signal's constellation is 180 degrees out of phase with the transmitted signal's constellation. If the constellation is 180 degrees out of phase, a transmitted maximum signal point will have a positive vector lying on the "Q" component. The received signal point will have a minimum value 908 and lie on the Q axis 902. The magnitude and phase of the "I" and "Q" vector components resolves the phase ambiguity.

Figure 10:
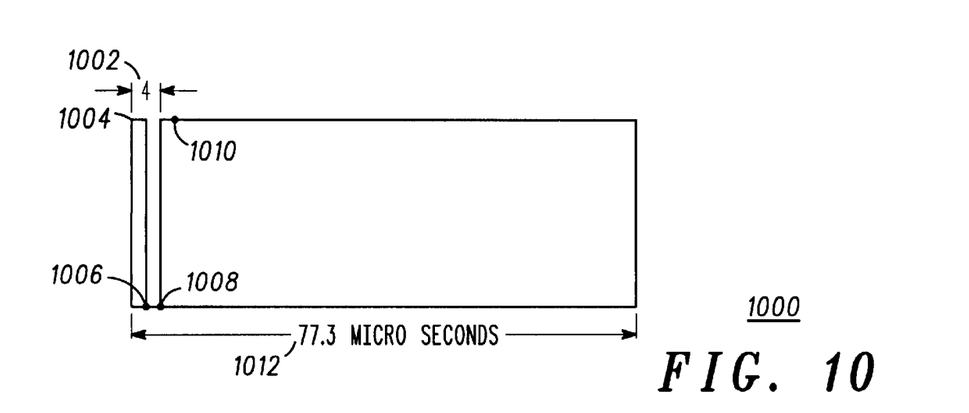
FIG. 10 is a drawing of a frame of an Advance Television Digital Standard with a code inserted into a "Q" QAM component.

FIG. 10 is a drawing of a frame 1000 of an Advance Television Digital Standard with a digital code being placed in a "Q" QAM component. A QAM vector defining the digital code in the segment synchronization portion 102 of the Grand Alliance Advance Television Specification data frame 1000 is generated by using known techniques. The first symbols of the digital code is made up of a maximum "Q" component signal point 1004, followed by a minimum "Q" component signal point 1006. The third digital code is a minimum "Q" component signal point 1008 followed by the fourth control code. The fourth digital code is a maximum "Q" component signal point 1010. One advantage of using a digital code with alternating minimum and maximum component signal points is a suppressed carrier transmission results and the carrier component that is generated by one symbol 1004 is canceled out by the next symbol 1106 because one symbol 1004 is a compliment of the following symbol 1106.

The receiving advance television receives the data frame 1012 and detects the four symbols 1004, 1006, 1008, 1010 that make up the segment synchronization portion 1002 of the frame 1012. If the symbols are received and the received signal is in phase synchronization with the corresponding transmitted signal, the vectors for the four signal points 1004, 1006, 1008, 1010 will only be in the "Q" component of the received signal. The order of the four signal points 1004, 1006, 1008, 1010, is as follows; maximum "Q" 1004, minimum "Q" 1006, minimum "Q" 1008, and maximum "Q" 1010.

If the received signal is not in phase alignment, the resulting vectors defining the four signal points will have "I" received signal components. If the "I" received signal component is negative, the received signal's phase plane is rotated clockwise. If the "I" received signal component is positive, the received signal's phase plane is rotated counterclockwise. If the signal points are compliments of the in phase signal points, the received signal must be rotated 180 degrees.

The methods of rotating the phase of a received signal are known in the art. Therefore, unambiguous phase synchronization is achieved in the preferred embodiment without costly additional circuitry or additional power requirements by detecting the resulting control code in a component of the received signal as explained above.

Figure 11:
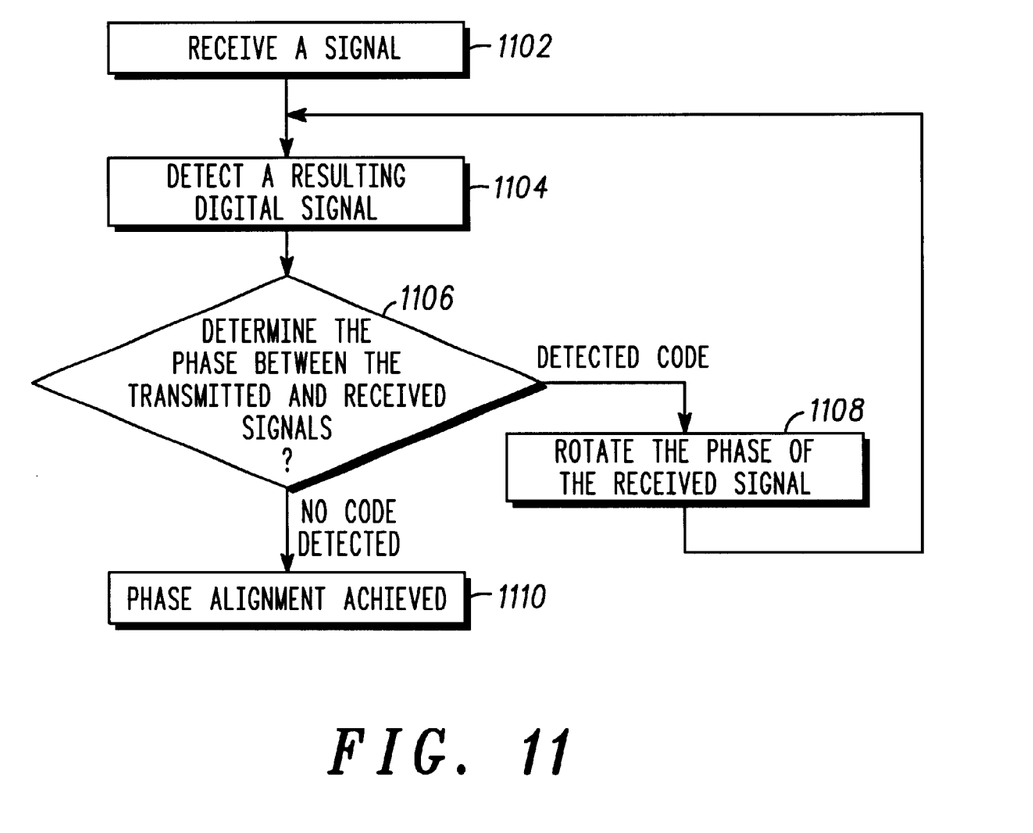
FIG. 11 is a flow chart of a method of unambiguous phase synchronization in accordance with the preferred embodiment of the invention.

Referring to FIG. 11, FIG. 11 is a flow chart of a method of achieving phase synchronization in accordance with the present invention. At step 1102, the receiver 600 receives a signal. The received signal is an advance digital television signal having a phase in relation to a transmitted signal. The advance digital television signal contains a first received signal component that has a predetermined offset from a second received signal component. The first received signal component and second received signal component in an advance digital television signal are the "I" QAM signal component and "Q" QAM signal component respectively.

At step 1104, the detector 612 detects a resulting digital code in the first signal component of the received signal. The digital code in the first received signal component corresponds to an original digital code transmitted in a plurality of frame synchronization bits in the transmitted signal component. The transmitted signal component containing the digital code corresponds to the second received signal component. The "Q" QAM component of the transmitted signal contains a digital code transmitted in a plurality of frame synchronization bits. The second received signal component is the "Q" QAM component of the received signal and contains a corresponding digital code. The first received signal component is the "I" QAM component and contains a digital code if the transmitted and received signals require phase alignment.

At step 1106, the detector 612 determines if the phase of the received signal requires rotation. If a digital code was detected in the first received signal component the received signal and transmitted signal are not phase aligned and rotation of the received signal is required. If the first received signal component does not contain a digital code and the polarity of the code in the second channel is correct, the transmitted signal and received signal are in phase alignment and no phase rotation of the received signal is required and the method proceeds to step 1110. If the polarity is wrong, 180 degree rotation is applied.

At step 1108, the phase of the received signal is rotated by the rotator 614. The rotation of the received signal in relation to the transmitted signal results in a rotated received signal. The method returns to step 1104 where the digital code is detected in the first component of the rotated received signal.

The method continues until phase synchronization is achieved at step 1110.

In an alternate embodiment, the control codes are placed in both components of a transmitted signal at step 1104. In QAM signaling, a digital code is placed in both the "I" component and "Q" component of the transmitted signal. By detecting the digital codes in both the "I" component and "Q" component of the received signal, phase synchronization can be efficiently accomplished. The detection of the digital codes includes knowing if the digital code is positive or negative. If the "I" and "Q" detected digital codes are positive, the phase of the received signal is rotated in a counter-clockwise direction until maximum values of both the "I" and "Q" digital codes is detected. If the "I" component of the received signal's detected digital code is positive and "Q" component of the received signal's detected digital code is negative, the phase of received signal is rotated counter-clockwise until the "I" component and "Q" component digital codes are maximum positive values. If the "I" component's digital code in the received signal is negative and the receive signal's "Q" component digital code is positive, the phase of the received signal is rotated clockwise until a maximum positive values of both "I" and "Q" component digital codes. If the "I" and "Q" component digital codes in the received signal are both negative, the phase of the received signal is inverted by 180 degrees and then adjusted for a maximum "I" and "Q" component digital code values in the received signal.

Therefore, by implementing the system, apparatus, or method of the present invention unambiguous phase synchronization can be achieved efficiently, inexpensively and without additional circuitry.

I claim:

1. A method for resolving carrier phase ambiguity comprising the step of determining a phase between a received signal including first and second received signal components, and a transmitted signal including a first transmitted signal component corresponding to the first received signal component and a second transmitted signal component corresponding to the second received signal component, the step of determining including the step of detecting a resulting binary code in the first received signal component corresponding to a phase shifted component of an original binary code transmitted in the second transmitted signal component.

2. A method according to claim 1 further comprising the step of rotating the received signal in a phase domain to reduce the phase.

3. A method according to claim 2 wherein the step of rotating the received signal comprises rotating the first received signal component and the second received signal component, wherein the second received signal component has a 90 degree phase offset in relation to the first received signal component of the received signal.

4. A method according to claim 3 wherein the step of rotating comprises rotating the received signal in a clockwise direction in relation to the corresponding transmitted signal.

5. A method according to claim 3 wherein the step of rotating comprises rotating the received signal in a counter-clockwise direction in relation to the corresponding transmitted signal.

6. A method according to claim 1 wherein the step of determining the phase between the received signal and the corresponding transmitted signal comprises determining the phase between a quadrature amplitude modulated signal and the corresponding transmitted signal, the quadrature amplitude modulated signal having an "I" signal component and a "Q" signal component.

7. A method according to claim 1 wherein the step of determining comprises detecting the resulting digital code in an advance digital television signal.

8. A method for resolving carrier phase ambiguity comprising the steps of:

receiving a received signal having a phase in relation to a corresponding transmitted signal, wherein the received signal contains a first received signal component with a predetermined phase offset from a second received signal component of the received signal, the transmitted signal also containing corresponding first and second transmitted signal components;

determining the phase between the received signal and the transmitted signal by detecting the presence of a resulting digital code in the first received signal component, the resulting digital code corresponding to an original digital code transmitted in the second transmitted signal component, wherein the second received signal component corresponds to the second transmitted signal component; and rotating the phase of the received signal in a phase domain until the received signal is in phase with the corresponding transmitted signal.

9. A method according to claim 8 wherein the step of rotating comprises rotating the received signal in a clockwise direction in relation to the corresponding transmitted signal.

10. A method according to claim 8 wherein the step of rotating comprises rotating the received signal in a counter-clockwise direction in relation to the corresponding transmitted signal.

11. A method according to claim 8 wherein the step of rotating comprises rotating the first received signal component and the second received signal component, wherein the second received signal component has a 90 degree phase offset in relation to the first received signal component of the received signal.

12. A method according to claim 8 wherein the step of receiving comprises receiving a quadrature amplitude modulated signal having an "I" signal component and a "Q" signal component.

13. A method according to claim 8 wherein the step of determining comprises detecting the resulting digital code in an advance digital television signal.

14. A method for resolving carrier phase ambiguity in a digital television system comprising the steps of:

receiving an advance digital television signal having a phase in relation to a transmitted signal, wherein the advance digital television signal contains a first received signal component with a predetermined phase offset from a second received signal component of the advance digital television signal, the transmitted signal also containing corresponding first and second transmitted signal components;

detecting a resulting digital code in the first received signal component, the resulting digital code corresponding to an original digital code transmitted in a plurality of synchronization bits in the second transmitted signal component wherein the second transmitted signal component corresponds to the second received signal component;

determining the phase between the advance digital television signal and the transmitted signal by evaluating the resulting digital code to determine a magnitude of a vector component corresponding to the resulting digital code in the first received signal component; and rotating, in a phase domain, the phase of the advance digital television signal until the vector component corresponding to the resulting digital code is minimized in the first received signal component.

15. An apparatus according to claim 14 comprising:

a detector detect the resulting digital code in the first received signal component of the received signal; and a rotator adapted to rotate the received signal in a phase domain to reduce the phase when the resulting digital code is detected.

16. An apparatus according to claim 15, the rotator adapted to rotate the first received signal component and the second received signal component, wherein the second received signal component has a 90 degree phase offset in relation to the first received signal component of the received signal.

17. An apparatus according to claim 16, the rotator adapted to rotate the received signal in a clockwise direction in relation to the corresponding transmitted signal.

18. An apparatus according to claim 16, the rotator adapted to rotate the received signal in a counter-clockwise direction in relation to the corresponding transmitted signal.

19. An apparatus according to claim 15 wherein the received signal is an advance digital television signal.

20. An apparatus according to claim 14 wherein the received signal is a quadrature amplitude modulated signal having an "I" signal component and a "Q" signal component of the received signal.

21. An apparatus comprising:
a receiver adapted to receive a received signal having a phase in relation to a corresponding transmitted signal, wherein the received signal contains a first received signal component with a predetermined phase offset from a second received signal component of the received signal, the transmitted signal containing corresponding first and second transmitted signal components, wherein the second received signal component corresponds to the second transmitted signal component and the first received signal component corresponds to the first transmitted signal component;
a detector adapted to determine the phase between the received signal and the transmitted signal by detecting a resulting digital code in the first received signal component, the resulting digital code corresponding to an original digital code transmitted in the second transmitted signal component; and
a rotator adapted to rotate the phase of the received signal in a phase domain until the received signal is in phase with the corresponding transmitted signal.

22. An apparatus according to claim 21, the rotator adapted to rotate the received signal in a clockwise direction in relation to the corresponding transmitted signal.

23. An apparatus according to claim 21, the rotator adapted to rotate the received signal in a counter-clockwise direction in relation to the corresponding transmitted signal.

24. An apparatus according to claim 21, the rotator adapted to rotate the first received signal component and the second received signal component, wherein the second received signal component has a 90 degree phase offset in relation to the first received signal component of the received signal.

25. An apparatus according to claim 21 wherein the received signal is a quadrature amplitude modulated signal having an "I" signal component and a "Q" signal component of the received signal.

26. An apparatus according to claim 21 wherein the received signal is an advance digital television signal.

27. An apparatus comprising:
a receiver adapted to receive an advance digital television signal having a phase in relation to a transmitted signal, wherein the advance digital television signal contains a first received signal component with a predetermined phase offset from a second received signal component of the advance digital television signal, the transmitted signal also containing corresponding first and second transmitted signal components;
a detector adapted to detect a resulting digital code in the first received signal component, the resulting digital code corresponding to an original digital code transmitted in a plurality of synchronization bits in the second transmitted signal component wherein the first transmitted signal component corresponds to the second received signal component, the detector further adapted to evaluate the phase between the advance digital television signal and the transmitted signal by evaluating the resulting digital code to determine a magnitude of a vector component corresponding to the resulting digital code in the first received signal component; and
a rotator adapted to rotate, in a phase domain, the phase of the advance digital television signal until the vector component corresponding to the resulting digital code is minimized in the first received signal component of the advance digital television signal.

28. A system comprising:
a transmitter having a transmit port adapted to transmitting a transmitted signal comprising a quadrature amplitude modulated signal having a first transmitted signal component and a second transmitted signal component, the transmitter further adapted to inserting a digital code into one of the transmitted signal components; and
a receiver having a receive port adapted to receiving a received signal, the receiver comprising a detector adapted to determining the presence of a phase between the received signal and the transmitted signal by determining whether a resulting digital code is present in a first received signal component of the received signal, the resulting digital code corresponding to the transmitted digital code in the second transmitted signal component; and
a rotator adapted to rotate the phase of the received signal in a phase domain until the received digital code is cancelled out, thereby indicating that the received signal is in phase with the transmitted signal.

29. The system according to claim 28 wherein the transmitted digital code is transmitted in a plurality of synchronization bits in the second transmitted signal component.

30. The system according to claim 28 wherein the transmitted signal is an advance digital television signal.

* * * * *

UNITED STATES PATENT AND TRADEMARK OFFICE
CERTIFICATE OF CORRECTION

PATENT NO. : 6,377,639 B1
DATED : April 23, 2002
INVENTOR(S) : Rzeszewski

It is certified that error appears in the above-identified patent and that said Letters Patent is hereby corrected as shown below:

<u>Title page,</u>
Add: -- [73] Assignee: Motorola, Inc., Schaumburg, IL (US) --
Change [76] Inventor: from "Theordore" to -- Theodore --

Signed and Sealed this

Third Day of September, 2002

*Attest:*

*Attesting Officer*

JAMES E. ROGAN
*Director of the United States Patent and Trademark Office*